(12) United States Patent
Yeh

(10) Patent No.: US 10,566,060 B2
(45) Date of Patent: Feb. 18, 2020

(54) MEMORY DEVICE AND PROGRAM/ERASE METHOD THEREFOR

(71) Applicant: Winbond Electronics Corp., Taichung (TW)

(72) Inventor: Jun-Lin Yeh, Zhubei (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/231,727

(22) Filed: Dec. 24, 2018

(65) Prior Publication Data

US 2019/0244670 A1 Aug. 8, 2019

(30) Foreign Application Priority Data

Feb. 2, 2018 (TW) .............................. 107103783 A

(51) Int. Cl.
| | |
|---|---|
| *G11C 16/16* | (2006.01) |
| *G11C 16/26* | (2006.01) |
| *G11C 16/34* | (2006.01) |
| *G06F 9/30* | (2018.01) |

(52) U.S. Cl.
CPC .......... *G11C 16/16* (2013.01); *G06F 9/30101* (2013.01); *G11C 16/26* (2013.01); *G11C 16/349* (2013.01); *G11C 16/3445* (2013.01); *G11C 16/3459* (2013.01)

(58) Field of Classification Search
CPC ..... G11C 16/16; G11C 16/26; G11C 16/3445; G11C 16/3459; G11C 16/349; G06F 9/30101
See application file for complete search history.

(56) References Cited

U.S. PATENT DOCUMENTS

| | | | |
|---|---|---|---|
| 8,874,993 B2 | 10/2014 | Eleftheriou et al. | |
| 10,445,229 B1* | 10/2019 | Kuzmin et al. | ........ G06F 3/0679 |
| 2011/0161784 A1* | 6/2011 | Selinger | .............. G06F 11/1068 714/768 |
| 2015/0293864 A1 | 10/2015 | Hill et al. | |
| 2019/0303236 A1* | 10/2019 | Ellis | ........................ G06F 3/065 |

* cited by examiner

*Primary Examiner* — Gene N Auduong
(74) *Attorney, Agent, or Firm* — Muncy, Geissler, Olds & Lowe, P.C.

(57) ABSTRACT

A memory device is provided and includes a status register, a memory array, a memory controller, an interface control circuit, and a write control logic circuit. The status register stores a plurality of status bits and a first threshold. The interface control circuit is controlled by the memory controller to perform a data program/erase operation on the memory array and re-program/re-erase the memory array in a retry mode when the data program/erase operation is not complete. The write control logic circuit counts the number of times the memory array is re-programmed/re-erased in the retry mode to generate a retry counting value, compares the retry counting value with the first threshold to generate a result signal. The status register updates a result bit included in the status bits according to the result signal. The memory controller determines whether the data program/erase operation is successful according to the result bit.

16 Claims, 4 Drawing Sheets

MEMORY DEVICE AND PROGRAM/ERASE METHOD THEREFOR

CROSS REFERENCE TO RELATED APPLICATIONS

This Application claims priority of Taiwan Patent Application No. 107103783, filed on Feb. 2, 2018, the entirety of which is incorporated by reference herein.

BACKGROUND OF THE INVENTION

Field of the Invention

The present invention relates to a memory device, and in particular it relates to a program/erase method for a flash memory.

Description of the Related Art

For memory devices such as flash memories, repeatedly programming and erasing the same memory cell will result in slower reading to the memory cell and may even result in failure of use of the memory cell. However, when a program/erase operation is performed on the memory device, there is no mechanism that can confirm whether the program/erase operation was successful. It will be found that the program/erase operation was unsuccessful only when the corresponding data read from the memory device does not match the written data.

BRIEF SUMMARY OF THE INVENTION

The present invention provides a memory device and a program/erasing method that can detect whether a program/erase operation is successful and further obtain the level of wear-out of memory cells.

An exemplary embodiment of a memory device is provided. The memory device comprises a status register, a first memory array, a memory controller, an interface control circuit, and a write control logic circuit. The status register stores a plurality of status bits and a first threshold. The plurality of status bits include a result bit. The interface control circuit is controlled by the memory controller to perform a data program/erase operation on the first memory array and re-program/re-erase the first memory array in a retry mode when the data program/erase operation is not complete. The write control logic circuit counts the number of tunes the first memory array is re-programmed/re-erased in the retry mode to generate a retry counting value. The write control logic circuit reads the first threshold from the status register to serve as a retry threshold and compares the retry counting value with the retry threshold to generate a result signal. The write control logic circuit further transmits the result signal to the status register. The status register updates the result bit according to the result signal. The interface control circuit reads the result bit from the status register and transmits the result bit to the memory controller, and the memory controller determines whether the data program/erase operation is successful according to the result bit.

An exemplary embodiment of a program/erase method for a memory device is provided. The program/erase method comprises the steps of transmitting a write enable command to a flash memory of the memory device to indicate that the flash memory will be programmed/erased; transmitting a program/erase command to the flash memory to perform a data program/erase operation on a memory array of the flash memory; transmitting a first status register read command to the flash memory; reading a busy bit from a status register of the flash memory according to the first status register read command; determining whether the data program/erase operation has been completed according to the busy bit; transmitting a second first status register read command to the flash memory when the data program/erase operation is complete; reading a result bit from the status register according to the second status register read command: and determining whether the data program/erase operation is successful according to the result bit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
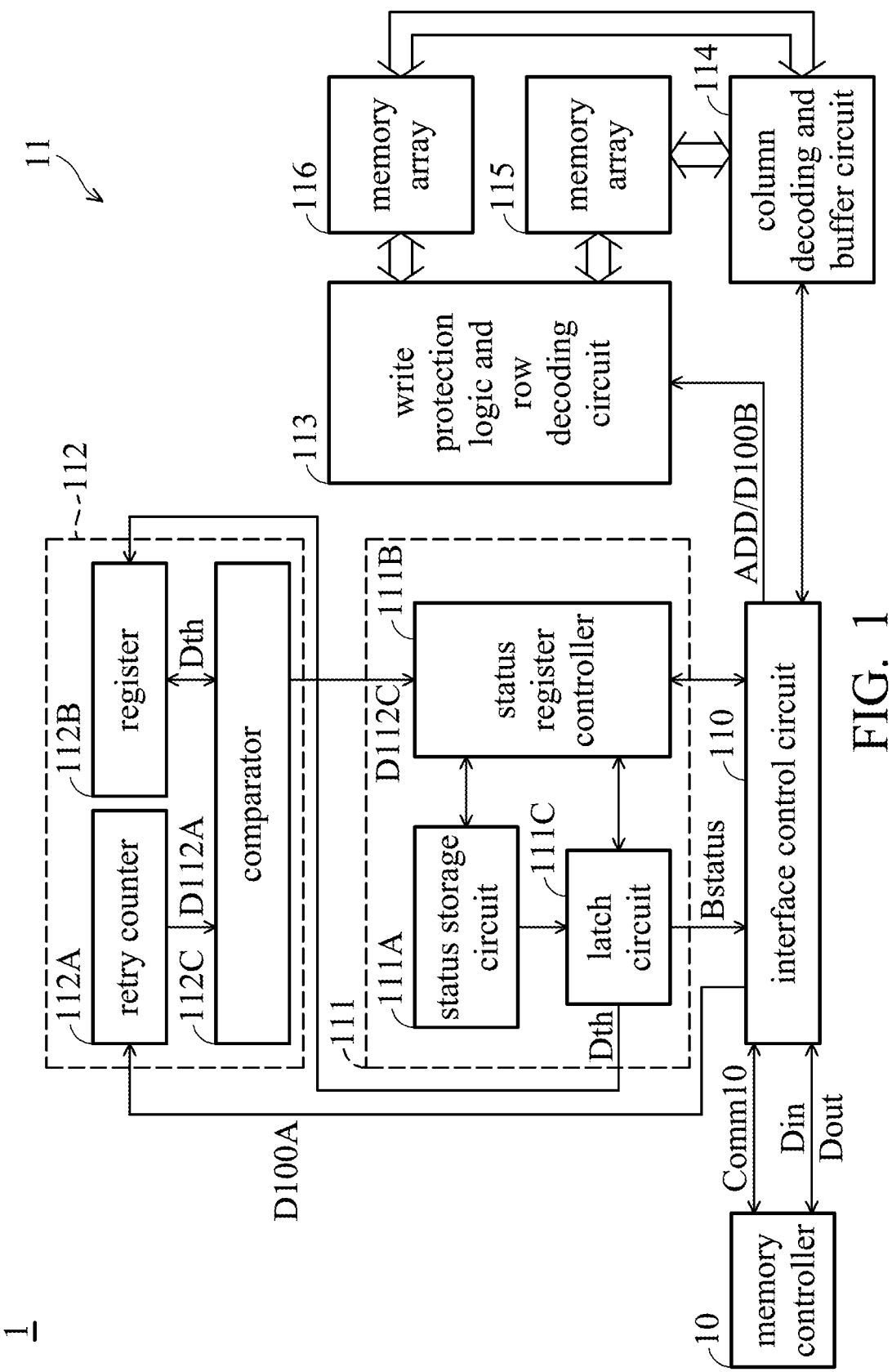
FIG. 1 shows an exemplary embodiment of a memory device.

FIG. 1 shows an exemplary embodiment of a memory device. Referring to FIG. 1, a memory device 1 comprises a memory controller 10 and a memory 11. The memory 11 can be a non-volatile memory, such as a flash memory. The memory 11 comprises an interface control circuit 110, a status register 111, a write control logic circuit 112, a write protection logic and row decoding circuit 113, a column decoding and buffer circuit 114, and memory arrays 115 and 116. The memory controller 10 transmits a command Comm10 to the interface control circuit 110 to control the flash memory 11. The command Comm10 transmitted by the memory controller 10 to the interface control circuit 110 may be a read enable command, a write enable command, a read command, a program/erase command, a status memory read command, and the like. The interface control circuit 110 decodes the received command and then transmit control signals and/or address signals to the status register 111, the write control logic circuit 112, the write protection logic and the row decoding circuit 113, and/or the column decoding and buffer circuit 114, thereby controlling their or its operation to perform a corresponding operation, such as a read, program, or erase operation. In this embodiment, the interface control circuit 110 is a serial peripheral interface (SPI) control circuit. For example, the memory device 1 is an SPI flash memory. The detailed operation and description will be described later.

The status register 111 comprises a status storage circuit 111A, a status register controller 111B, and a latch circuit 111C. The status storage circuit 111A stores status bits related to the operation status of the flash memory 11. These status bits are written into the status storage circuit 111A through controlling the interface controller 110 and the status register controller 111B by the memory controller 10. When the memory controller 10 transmits a status register read command to the interface control circuit 110, the status register controller 111B is controlled by the interface control circuit 110 to perform a status read operation on the status storage circuit 111A. At this time, the status bits from the status storage circuit 111E are temporarily stored in the latch circuit 1110. The interface control circuit 110 reads the status bits from the latch circuit 111C and transmits the read status bits Bstatus to the memory controller 10. According to the order in which the interface control circuit 110 transmits the status bits, for example, the status bits Bstatus comprise two code sets: a first code set and a second code set. The first code set includes bits S0-S7 which are BUSY, WEL, BP0, BP1, BP2, T/B, SEC, and SRP0 respectively. BUSY is a busy bit which indicates whether the flash memory 10 is performing a data program/erase operation; WEL is a write enable latch bit which indicates whether a write operation is enabled; BP0, BP1, and BP2 are block protection bits which provide the control of the write protection; T/B is a top/bottom block protection bit which controls if the block protection bits (BP0, BP1, and BP2) protect a top block or a bottom block of a memory array; SEC is a sector/block protection bit which controls if the block protection bits (BP0, BP1, and BP2) protect sectors or blocks of a top block or a bottom block in a memory array; and SPR0 is a status register protection bit which indicates whether a write operation is enabled for the first set of codes (S0-S7).

Figure 2:
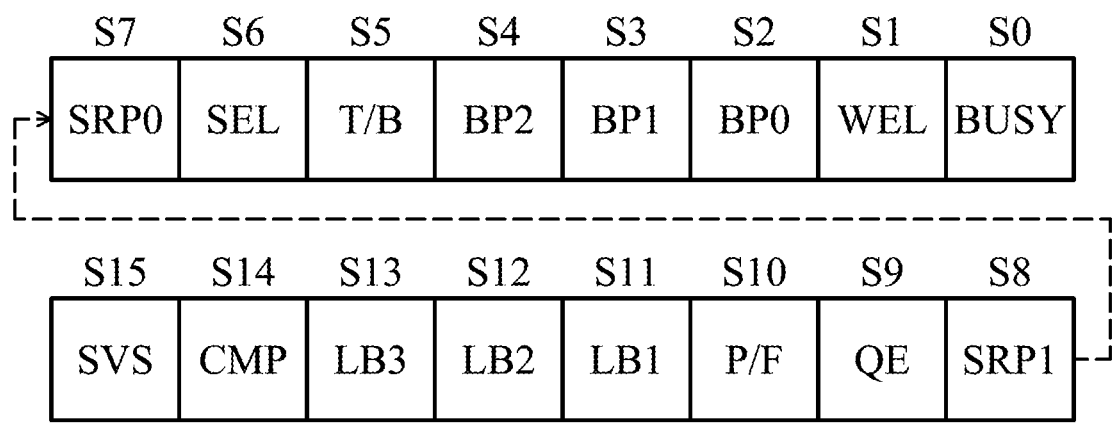
FIG. 2 is a schematic diagram showing status bits according to an exemplary embodiment.

The second code set includes bits S8-S15 which are SPR1, QE, P/F, LB1, LB2, LB3, CMP, and SUS respectively. SRP1 is a status register protection which indicated whether a write operation is enabled for the second code set (S8-S15); QE is a quad enable bit which indicates whether a quad SPI operation is enabled; P/F is a result bit which indicates whether a data program/erase operation is successful; LB1, LB2, and LB3 are security register lock bits which control protection of a write operation for the security register; CMP is a complement protection bit which is used in conjunction with bits SEC, T/B, BP2, BP1, and BP0 to provide more flexibility for array protection; SUS is a program/erase suspend status bit which indicates whether a program/erase suspend instruction is executed. The bits included in above first and second code sets are given as an example. In other embodiments, the number of code sets and the number of bits in each code set can be determined or configured according to the actual requirements, without the limitation shown in FIG. 2.

The status storage circuit 111A also stores a retry threshold for a retry operation. When the status register controller 111B performs a status read operation on the status storage circuit 111A, the retry threshold is temporarily stored in the latch circuit 111C. The write control logic circuit 112 reads the retry threshold Dth from the latch circuit 111C and stores it.

Referring to FIG. 1, the write control logic circuit 112 comprises a retry counter 112A, a register 112B, and a comparator 112C. During the period when a program/erase operation is performed on the memory array 115/116, the retry counter 112A is controlled by the control signal D100A provided by the interface control circuit 110 to count the number of times the memory array 115/116 is re-programmed/re-written in this period and generates a retry counting value D112A according to the counting result. Whenever the retry counter 112A obtains the retry counting value D112A, it transmits the retry counting value D112A to the comparator 112O. The register 112B stores the retry threshold Dth read from the latch circuit 111C. When the comparator 112C performs a comparison operation, it reads the retry threshold Dth from the register 112B and compares the retry counting value D112A with the retry threshold Dth. The comparator 112C generates a result signal D112C according to the comparison result and transmits it to the status register 111. The status register controller 111B of the status register 111 performs a write operation on the status storage circuit 111A according to the result signal D112C to update the result bit P/F (S10).

A program/erase operation of the memory device 1 will be described below with reference to FIGS. 1-4.

When data is to be written to the memory array 115, the memory device 1 enters a data program/erase operation. During the data program/erase operation, the memory controller 10 transmits a write enable command to the interface control circuit 110 to indicate that the program/erase operation is enabled. The memory controller 10 then transmits a program/erase command and input data Din to the interface control circuit 110. The interface control circuit 110 decodes the received program/erase command. At this time, the interface control circuit 110 controls the status register controller 111B to set the bit BUSY (S0) stored in the status storage circuit 111A to be in a state (for example, S0=1) indicating that the data program/erase operation is being performed. The interface control circuit 110 further transmits a corresponding address signal ADD and a control signal D100B to the write protection logic and row decoding circuit 113. The write protection logic and row column decoding circuit 113 writes the contents of the input data Din to specific memory cells in the memory array 115 according to the address signal ADD and the control signal D100B. During the data program/erase operation, whenever a program/write operation is performed on the memory array 115 once, the memory controller 10 controls the interface control circuit 110 to perform a read operation on the memory array 115 through the column decoding and buffer circuit 114 and reads read-out data Dout from the specific memory cells corresponding to the address signal ADD. Then, the memory controller 10 determines whether the read-out data Dout matches the input data Din. When the memory controller 10 determines that the read-out data Dout does not match the input data Din, the memory controller 10 determines that the data program/erase operation is not complete and activates a retry mode. In the retry mode, the memory controller 10 controls the interface control circuit 110 to re-program/re-erase the memory array 115. At this time, the interface control circuit 110 transmits the control signal D100A to the retry counter 112A to control it to start counting the number of times the memory array 115 is re-programmed/re-written during this program/erase operation. When the memory controller 10 determines that the read-out data Dout matches the input data Din or that a predetermined retry period is ended (i.e., the data program/erase operation is complete), the memory controller 10 ends the retry mode. At the end of the retry mode, the retry counter 112A stops counting and transmits the retry count value D112A to the comparator 112C. After that, the retry counter 112A is reset by the interface control circuit 110. The comparator 112C generates the result signal D112C according to the comparison result to update the result bit S10 (P/F). In addition, when the data program/erase operation is complete, the interface control circuit 110 controls the status register controller 111B to update the BUSY bit S0 stored in the status storage circuit 111A to be in a state (for example, S0=0) indicating that the data program/erase operation is not being performed.

During the data program/erase operation, the memory controller 10 transmits a status register read command (also referred to as "first status register read command") to the interface control circuit 110 to the interface control circuit 110 to read the bits S0-S7 included in the status bits Bstatus from the status storage circuit 111A through the interface control circuit 110. The memory controller 10 determines that the data program/erase operation is complete according to the BUSY bit (S0). At this time, the memory controller 10 transmits another status register read command (also referred to as "second status register read command") to the interface control circuit 110 to read the bits S8-S15 included in the status bits Bstatus from the status storage circuit 111A through the interface control circuit 110. The memory controller 10 determines whether the data program/erase operation is successful according to the P/F bit (S10).

In general, programming and erasing the same memory cell repeatedly will result in that the read and write performed on the memory cell slows down, incorrect data is written, the programming/erasing is failed, and even the memory cell is damaged and unusable. A retry mode for a memory is to re-program/re-erase memory cells in the hope of correctly writing input data to a memory array. The more serious the memory cells are damaged, the more times the memory cells are programmed/erased, that is, the number of times the memory cells are re-programmed/re-erased is related to (proportional to) the degree of the damage of the memory cells. Therefore, according to the embodiment of the present invention, whether the data program/erase operation is successful is determined by comparing the retry count value D112A with the retry threshold Dth, so as to infer whether the memory array is damaged and unusable. In this way, the system using the memory device 1 may perform some preventative mechanism before the wear-out becomes severe. For example, if it is determined that the data program/erase operation is not successful, the memory controller 10 controls the interface control circuit 110 to switch to perform the data program/erase operation on the other memory array 116.

In an embodiment, the retry threshold Dth stored by the status storage circuit 111A is a default threshold, which may be the retry counting value corresponding to the failure of the memory array predicted by the manufacturer after testing (i.e., the outgoing program/erase retry counting value). Therefore, when the retry counting value D112A reaches the retry threshold Dth, the memory array 115 is regarded as a damaged array, and the data program/erase operation is not successful. In another embodiment, after the memory device 1 is shipped, another threshold may be written to the status storage circuit 111A instead of the default threshold as a new retry threshold Dth. The new retry threshold Dth is less than the default threshold, for example, the new retry threshold is 70% of the default threshold. In this case, when it is determined that the data program/erase operation is not successful, the memory array 115 has not been damaged yet, and the input data may have been correctly written to the memory array 115. At this time, the memory controller 10 can learn in advance that the current state of the memory array 115 is close to a damaged state by reading the P/F bit and the further perform a prevention operation, for example, the memory controller 10 may perform a read operation or a program/erase operation on another memory array 116.

Figure 3:
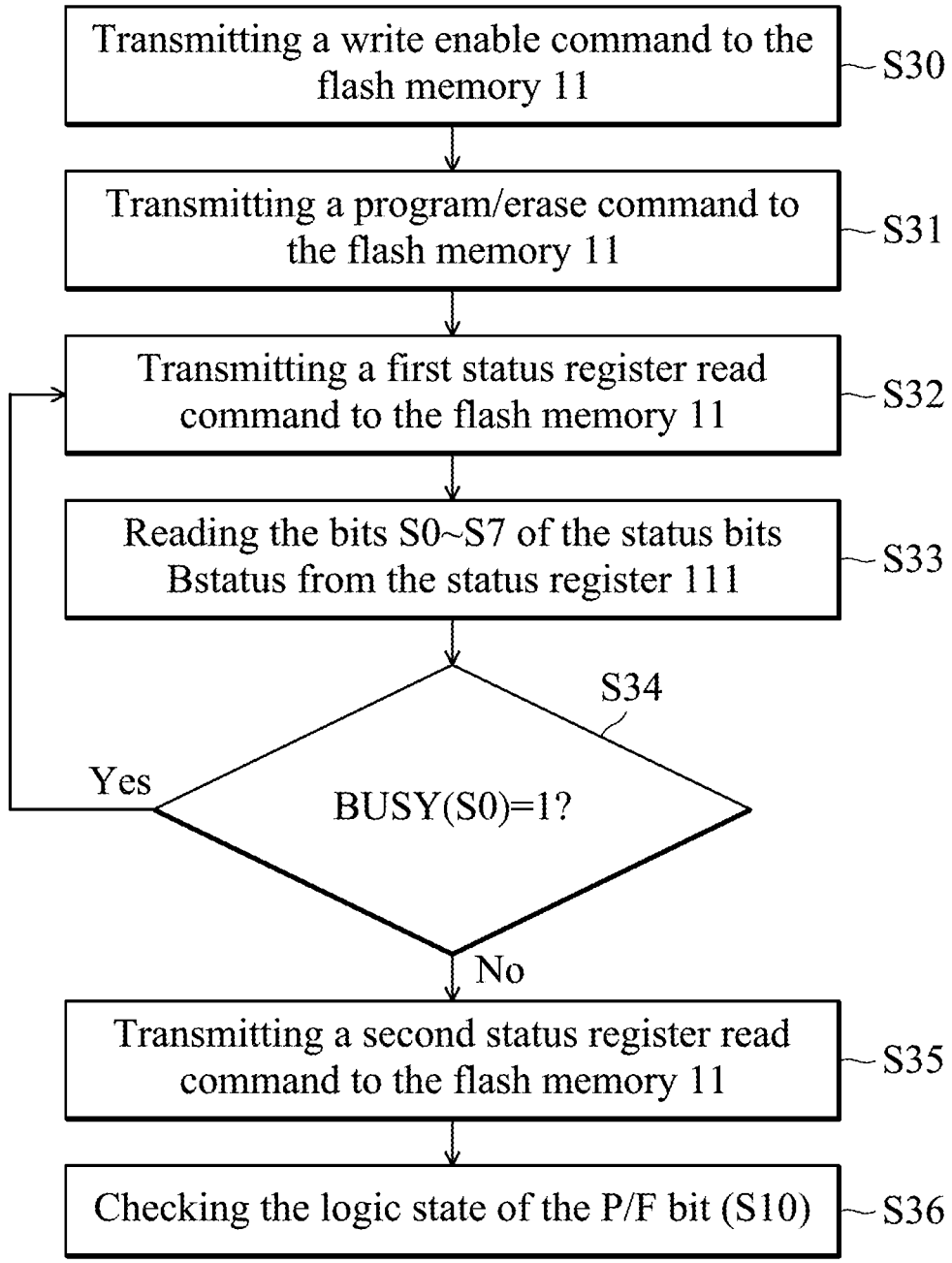
FIG. 3 is a flowchart of one exemplary embodiment of a program/erase method.

FIG. 3 shows an exemplary embodiment of a program/erase operation. When a data program/erase operation is to be performed, the memory controller 10 transmits a write enable command to the flash memory 11 (step S30) to indicate that the flash memory 11 will be programmed/erased. Then, the memory controller 10 transmits a program/erase command to the flash memory 11 (step S31). After receiving the program/erase command, the flash memory 11 decodes the program/erase command to control the write protection logic and row decoding circuit 113 to write the input data Din from the memory controller 10 into the corresponding memory cells. During the data program/erase operation, the memory controller 10 transmits a status register read command (also referred to as "first status register read command") to the flash memory 11 (step S32) and reads the bits S0-S7 included in the status bits Bstatus from the status register 111 (step S33). Next, the memory controller 10 determines whether the BUSY bit (S0) is in the logic state "1" (BUSY=1?) to determine whether the data program/erase operation has been completed (step S34).

When the BUSY bit is in the logic state "1" (BUSY=1) (step S34—Yes), the memory controller 10 determines that the data program/erase operation is still being performed and has not been completed yet. At this time, the method for the program/erase operation returns to the step S32 to determine whether the data program/erase operation has been completed by reading the BUSY bit. When the BUSY bit is not in the logic state "1" (i.e., BUSY=0) (step S34—NO), the memory controller 10 determines that the data program/erase operation is complete. Then, the memory controller 10 transmits another status register read command (also referred to as "second status register read command") to the flash memory 11 (step S35) to read the bits S8-S15 included in the status bits Bstatus from the status register 111 through the interface control circuit 110. The memory controller 10 checks the logic state of the P/F bit (S10) (step S36) and determines whether the data program/erase operation is successful according to the logic state of the P/F bit (S10).

Figure 4:
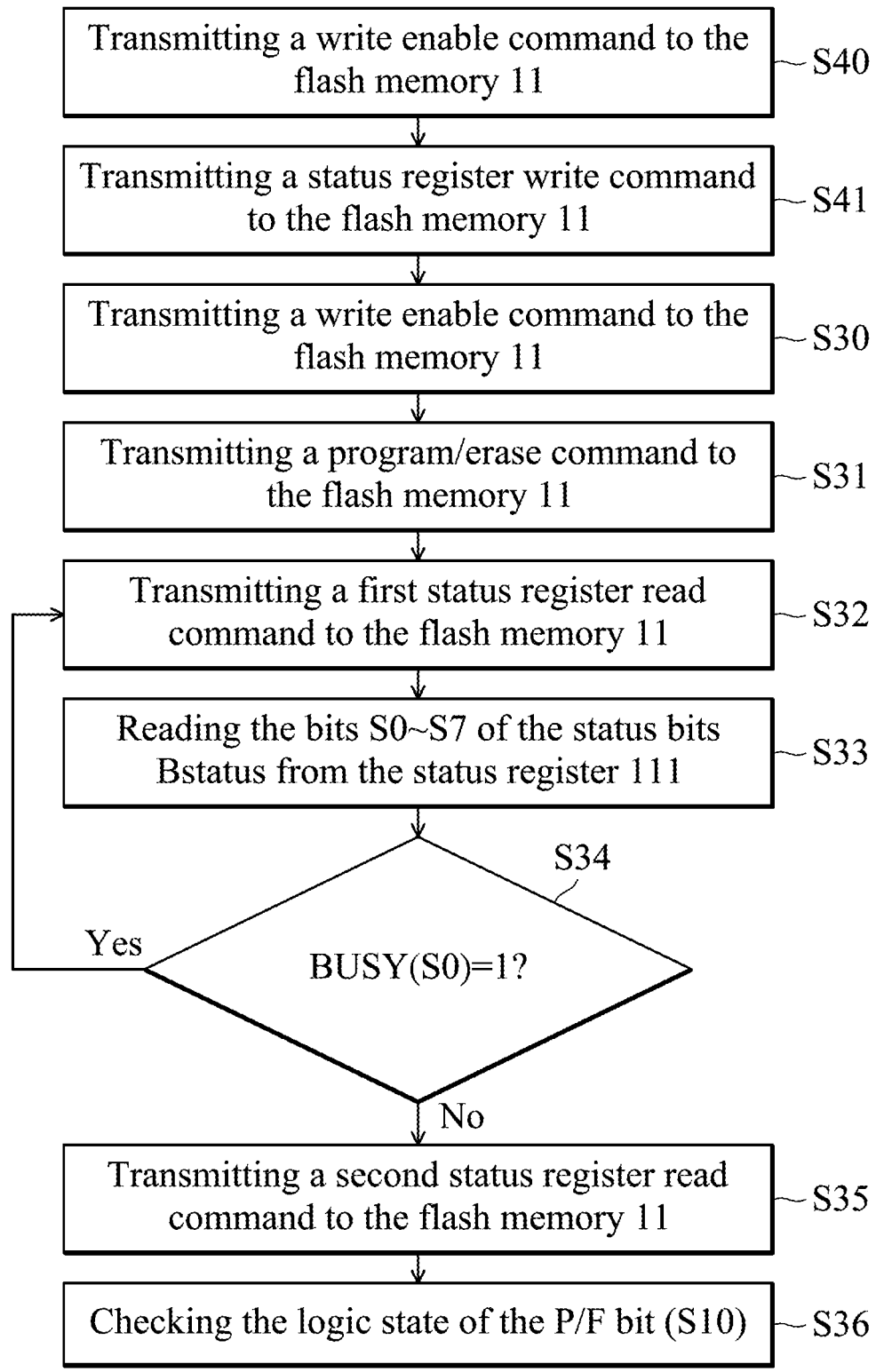
FIG. 4 is a flowchart of another exemplary embodiment of a program/erase method.

In another embodiment, if it is desired to change the aforementioned retry threshold, the changing operation needs to be completed before the memory device 1 enters the data program/erase operation. Referring to FIG. 4, the memory controller 10 transmits a write enable command to the flash memory 11 (step S40) to indicate that the flash memory 11 will be programmed/erased. The memory controller 10 then transmits a status register write command to the flash memory 11 (step S41). The interface control circuit 110 of the flash memory 11 controls the status register controller 111B to write a new threshold to the status storage circuit 111A according to the status register write command, and the new threshold replaces the default threshold as a new retry threshold Dth. After that, when the memory device 1 is to perform a data program/erase operation, the steps S30-S36 shown in the FIG. 3 will be executed. The related description is omitted here.

According to the embodiments of the present invention, the status bit Bstatus received by the interface control circuit 110 of the SPI flash memory 1 has a pass/fail (P/F) bit related to a program/erase operation. Whether the current state of the memory array is close to a damaged state can be determined according to the value of the P/F bit. In addition, the SPI flash memory 1 also has a threshold which is equal to a percentage of the outgoing program/erase retry counting value, and the threshold serves as a basis used for whether the P/F bit is updated.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device comprising:
   a status register storing a plurality of status bits and a first threshold, wherein the plurality of status bits include a result bit;
   a first memory array;
   a memory controller;
   an interface control circuit controlled by the memory controller to perform a data program/erase operation on the first memory array and re-program/re-erase the first memory array in a retry mode when the data program/erase operation is not complete; and
   a write control logic circuit counting the number of times the first memory array is re-programmed/re-erased in the retry mode to generate a retry counting value, reading the first threshold from the status register, comparing the retry counting value with the retry threshold to generate a result signal, and transmitting the result signal to the status register, wherein the first threshold from the status register serves as a retry threshold,
   wherein the status register updates the result bit according to the result signal, and
   wherein the interface control circuit reads the result bit from the status register and transmits the result bit to the memory controller, and the memory controller determines whether the data program/erase operation is successful according to the result bit.

2. The data program/erase operation as claimed in claim 1,
   wherein during the data program erase operation, the memory controller transmits input data and controls the interface control circuit to perform the data program/erase operation to write the input data into a plurality of specific memory cells of the first memory array,
   wherein during the data program/erase operation, the memory controller controls the interface control circuit to perform a read operation to read read-out data from the plurality of specific memory cells and determines whether the read-out data matches the input data, and
   wherein the memory controller determines that the read-out data does not match the input data, the memory controller determines that the data program/erase operation is not complete and activates the retry mode to control the interface control circuit to re-program/re-erase the first memory array.

3. The data program/erase operation as claimed in claim 1, wherein the status register comprises:
   a status storage circuit storing the first threshold and the plurality of status bits, wherein the plurality of status bits include a busy bit which indicates whether the data program/erase operation is being performed;
   a latch circuit coupled to the status storage circuit; and
   a status register controller performing a status read operation on the status storage circuit such that the first threshold and the plurality of status bits are read to the latch circuit,
   wherein the write control logic circuit reads the first threshold from the latch circuit, and the interface control circuit reads the plurality of status bits from the latch circuit.

4. The data program/erase operation as claimed in claim 1,
   wherein when the memory controller transmits a threshold setting command to the interface control circuit, the interface control circuit controls the status register controller to write a second threshold into the status storage circuit, and
   wherein after the second threshold is written into the status storage circuit, the write control logic circuit reads the second threshold from the status register to serve as the retry threshold.

5. The data program/erase operation as claimed in claim 4, whether the first threshold is greater than the second threshold.

6. The data program/erase operation as claimed in claim 1, wherein the write control logic circuit comprises:
   a retry counter controlled by the interface control circuit to count the number of times the first memory array is re-programmed/re-erased in the retry mode and generate the retry counting value,
   a register storing the retry threshold; and
   a comparator coupled to the retry counter and the register to receive the retry counting value and the retry threshold respectively and comparing the retry counting value with the retry threshold to generate the result signal.

7. The data program/erase operation as claimed in claim 1, further comprising:
   a second memory array,
   wherein when the memory controller determines that the data program/erase operation performed on the first memory array is not successful, the memory controller controls the interface control circuit switches to perform the data program/erase operation on the second memory array.

8. The data program/erase operation as claimed in claim 1, wherein retry counting value is proportional to a degree of damage of the first memory array.

9. The data program/erase operation as claimed in claim 1, wherein the memory device is a serial peripheral interface (SPI) flash memory.

10. A program/erase method for a memory device, comprising:
    transmitting a write enable command to a flash memory of the memory device to indicate that the flash memory will be programmed/erased;
    transmitting a program/erase command to the flash memory to perform a data program/erase operation on a memory array of the flash memory;
    transmitting a first status register read command to the flash memory;
    reading a busy bit from a status register of the flash memory according to the first status register read command;
    determining whether the data program/erase operation has been complete according to the busy bit;
    transmitting a second first status register read command to the flash memory when the data program/erase operation is complete;
    reading a result bit from the status register according to the second status register read command; and
    determining whether the data program/erase operation is successful according to the result bit.

11. The program/erase method as claimed in claim 10, further comprising:
    during the data program/erase operation, writing input data into a plurality of specific memory cells of the first memory array of the flash memory;

during the data program/erase operation, reading read-out data from the plurality of specific memory cells;

determining whether the read-out data matches the input data; and when the read-out data does not match the input data, determining that the data program/erase operation is not complete and activating a retry mode to re-program/re-erase the memory array.

12. The program/erase method as claimed in claim 11, wherein the result bit is determined according to whether a retry counting value which is related to the number of times the memory array is re-programmed/re-erased reaches a retry threshold.

13. The program/erase method as claimed in claim 12, further comprising:

transmitting a status register write command to the flash memory to write the retry threshold into the status register of the flash memory.

14. The program/erase method as claimed in claim 12, wherein retry counting value is proportional to the degree of damage of the first memory array.

15. The program/erase method as claimed in claim 10, wherein the result bit is stored in the status register of the flash memory.

16. The program/erase method as claimed in claim 10, wherein the memory device is a serial peripheral interface (SPI) flash memory.

* * * * *